US012381105B2

United States Patent
Wang et al.

(10) Patent No.: US 12,381,105 B2
(45) Date of Patent: Aug. 5, 2025

(54) COOLANT CHANNEL WITH INTERNAL FINS FOR SUBSTRATE PROCESSING PEDESTALS

(71) Applicant: LAM RESEARCH CORPORATION, Fremont, CA (US)

(72) Inventors: Feng Wang, Sunnyvale, CA (US); Alexander Matyushkin, San Jose, CA (US); Darrell Ehrlich, San Jose, CA (US); Eric Samulon, Oakland, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 98 days.

(21) Appl. No.: 17/799,897

(22) PCT Filed: Feb. 18, 2021

(86) PCT No.: PCT/US2021/018445
§ 371 (c)(1),
(2) Date: Aug. 15, 2022

(87) PCT Pub. No.: WO2021/168027
PCT Pub. Date: Aug. 26, 2021

(65) Prior Publication Data
US 2023/0087913 A1 Mar. 23, 2023

Related U.S. Application Data

(60) Provisional application No. 62/978,899, filed on Feb. 20, 2020.

(51) Int. Cl.
*H01L 21/00* (2006.01)
*H01J 37/32* (2006.01)
(Continued)

(52) U.S. Cl.
CPC .... *H01L 21/6833* (2013.01); *H01J 37/32724* (2013.01); *H01L 21/67109* (2013.01)

(58) Field of Classification Search
CPC .................................................. H01L 21/67109
See application file for complete search history.

(56) References Cited

U.S. PATENT DOCUMENTS 7,649,729 B2 * 1/2010 Buchberger, Jr. ..........................
H01L 21/67109
361/234
2007/0165356 A1 7/2007 Nguyen et al.
(Continued)

FOREIGN PATENT DOCUMENTS

JP 2003257943 A 9/2003
JP 2011040528 A * 2/2011
(Continued)

OTHER PUBLICATIONS

International Search Report and Written Opinion of the ISA issued in PCT/US2021/018445, mailed Jun. 9, 2021; ISA/KR, 6 pages.
(Continued)

*Primary Examiner* — Eric S Ruppert (57) ABSTRACT

A baseplate for a substrate support in a substrate processing system includes at least one coolant channel formed within the baseplate. The at least one coolant channel defines a volume within the baseplate configured to retain a coolant and follows a path configured to distribute the coolant in the volume throughout the baseplate. At least one fin is provided within the at least one coolant channel. The at least one fin extends from at least one of a top, a bottom, and a sidewall of the at least one coolant channel into the volume to increase a surface area of the at least one coolant channel.

29 Claims, 5 Drawing Sheets

(51) Int. Cl.
    *H01L 21/67*     (2006.01)
    *H01L 21/683*     (2006.01)

(56) References Cited

U.S. PATENT DOCUMENTS

| | | |
|---|---|---|
| 2008/0173432 A1 | 7/2008 | Shuy |
| 2008/0178608 A1* | 7/2008 | Tandou .................. F25B 39/02 62/515 |
| 2009/0197418 A1* | 8/2009 | Sago ................. H01L 21/67017 438/758 |
| 2015/0059979 A1 | 3/2015 | Kim et al. |
| 2017/0040190 A1 | 2/2017 | Benjaminson et al. |
| 2019/0013231 A1* | 1/2019 | Yamaguchi ....... H01L 21/67103 |
| 2019/0376183 A1 | 12/2019 | Shanbhag et al. |
| 2020/0168523 A1* | 5/2020 | Huang ................... F28F 13/18 |
| 2020/0279721 A1 | 9/2020 | White et al. |

FOREIGN PATENT DOCUMENTS

| | | |
|---|---|---|
| JP | 2011165939 A | 8/2011 |
| JP | 2014195047 A | 10/2014 |
| JP | 2016528743 A | 9/2016 |
| JP | 2018006768 A | 1/2018 |
| JP | 2019041024 A | 3/2019 |
| JP | 2019075399 A | 5/2019 |
| KR | 1020140047558 A | 4/2014 |
| KR | 1020150025242 A | 3/2015 |

OTHER PUBLICATIONS

Japanese Office Action for Japanese Application No. 2022-549846 dated Feb. 4, 2025.

* cited by examiner

COOLANT CHANNEL WITH INTERNAL FINS FOR SUBSTRATE PROCESSING PEDESTALS

CROSS-REFERENCE TO RELATED APPLICATIONS

This application is a U.S. National Phase Application under 35 U.S.C. 371 of International Application No. PCT/US2021/018445, filed on Feb. 18, 2021, which claims the benefit of U.S. Provisional Application No. 62/978,899, filed on Feb. 20, 2020. The entire disclosures of the applications referenced above are incorporated herein by reference.

FIELD

The present disclosure relates to coolant channels in a substrate support of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, etch processes (e.g., chemical etch, plasma etch, reactive ion etch, etc.), a plasma enhanced chemical vapor deposition (PECVD) process, a chemically enhanced plasma vapor deposition (CEPVD) process, a sputtering physical vapor deposition (PVD) process, an ion implantation process, and/or other deposition and cleaning processes.

A substrate may be arranged on a substrate support, such as a pedestal, an electrostatic chuck (ESC), etc. in a processing chamber of the substrate processing system and a gas mixture including one or more process gases may be introduced into the processing chamber. For example, during plasma-based etching processes, a gas mixture including one or more precursors is introduced into the processing chamber and plasma is struck to etch the substrate.

SUMMARY

A baseplate for a substrate support in a substrate processing system includes at least one coolant channel formed within the baseplate. The at least one coolant channel defines a volume within the baseplate configured to retain a coolant and follows a path configured to distribute the coolant in the volume throughout the baseplate. At least one fin is provided within the at least one coolant channel. The at least one fin extends from at least one of a top, a bottom, and a sidewall of the at least one coolant channel into the volume to increase a surface area of the at least one coolant channel.

In other features, the at least one fin extends upward from the bottom of the at least one coolant channel into the volume. The at least one fin extends downward from the top of the at least one coolant channel into the volume. The at least one fin includes a first fin extending upward from the bottom of the at least one coolant channel into the volume and a second fin extending downward from the top of the at least one coolant channel into the volume. The at least one fin includes a first fin extending upward from the bottom of the at least one coolant channel into the volume, a second fin extending downward from the top of the at least one coolant channel into the volume, and a third fin extending inward from the sidewall of the at least one coolant channel into the volume.

In other features, the at least one fin includes a first fin and a second fin extending inward from the sidewall of the at least one coolant channel into the volume. The at least one fin includes a first fin and a second fin, the at least one coolant channel includes a first coolant channel and a second coolant channel, the first coolant channel includes the first fin, and the second coolant channel includes the second fin. The second coolant channel is arranged above the first coolant channel. The second coolant channel is aligned with the first coolant channel in a vertical direction. The second coolant channel is offset from the first coolant channel in a vertical direction. The first coolant channel and the second coolant channel are coplanar.

In other features, the at least one fin has a rectangular cross-sectional shape. The at least one fin has a triangular cross-sectional shape. The at least one fin has a trapezoidal cross-sectional shape. The at least one fin has a curved cross-sectional shape. The at least one fin extends continuously from an inlet of the at least one coolant channel to an outlet of the at least one coolant channel. The at least one fin is discontinuous. The at least one fin is provided in a first portion of the at least one coolant channel and is not provided in a second portion of the at least one coolant channel. The first portion and the second portion correspond to first and second zones, respectively, of the baseplate.

In other features, a configuration of the at least one fin changes along a length of the at least one coolant channel. The configuration of the at least one fin includes at least one of a shape, a size, a location, and a quantity of the at least one fin. The configuration of the at least one fin continues for at least one revolution of the at least one coolant channel. First and second ends of the at least one fin include sloped transition regions. A width of the at least one fin is 30-50% of a width of the at least one coolant channel. A height of the at least one fin is 20-40% of a height of the at least one coolant channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate may be arranged on a substrate support, such as a pedestal, an electrostatic chuck (ESC), etc. in a processing chamber of a substrate processing system. Typically, the substrate support includes one or more metallic and/or ceramic components. For example, the substrate support may include a metallic (e.g., aluminum) baseplate and a ceramic layer arranged on the baseplate.

During processing, (e.g., deposition and or etching), the substrate is exposed to various gas mixtures and energy sources, such as in radio frequency (RF) plasma deposition and etching steps. One or more control schemes may be implemented to manage temperatures of the substrate and/or substrate support. For example, the baseplate of the substrate support may include a coolant channel configured to flow coolant to transfer heat from the substrate support and maintain the substrate at desired temperatures.

Systems and methods according to the present disclosure implement a coolant channel that includes internal features, such as fins, configured to increase cooling efficiency and improve temperature uniformity. For example, the internal features increase a convection surface area of the coolant channel to increase both cooling efficiency and maximum power limits for processes performed in the processing chamber. Further, temperature uniformity can be improved by arranging the internal features at different location along the coolant channel.

Figure 1:
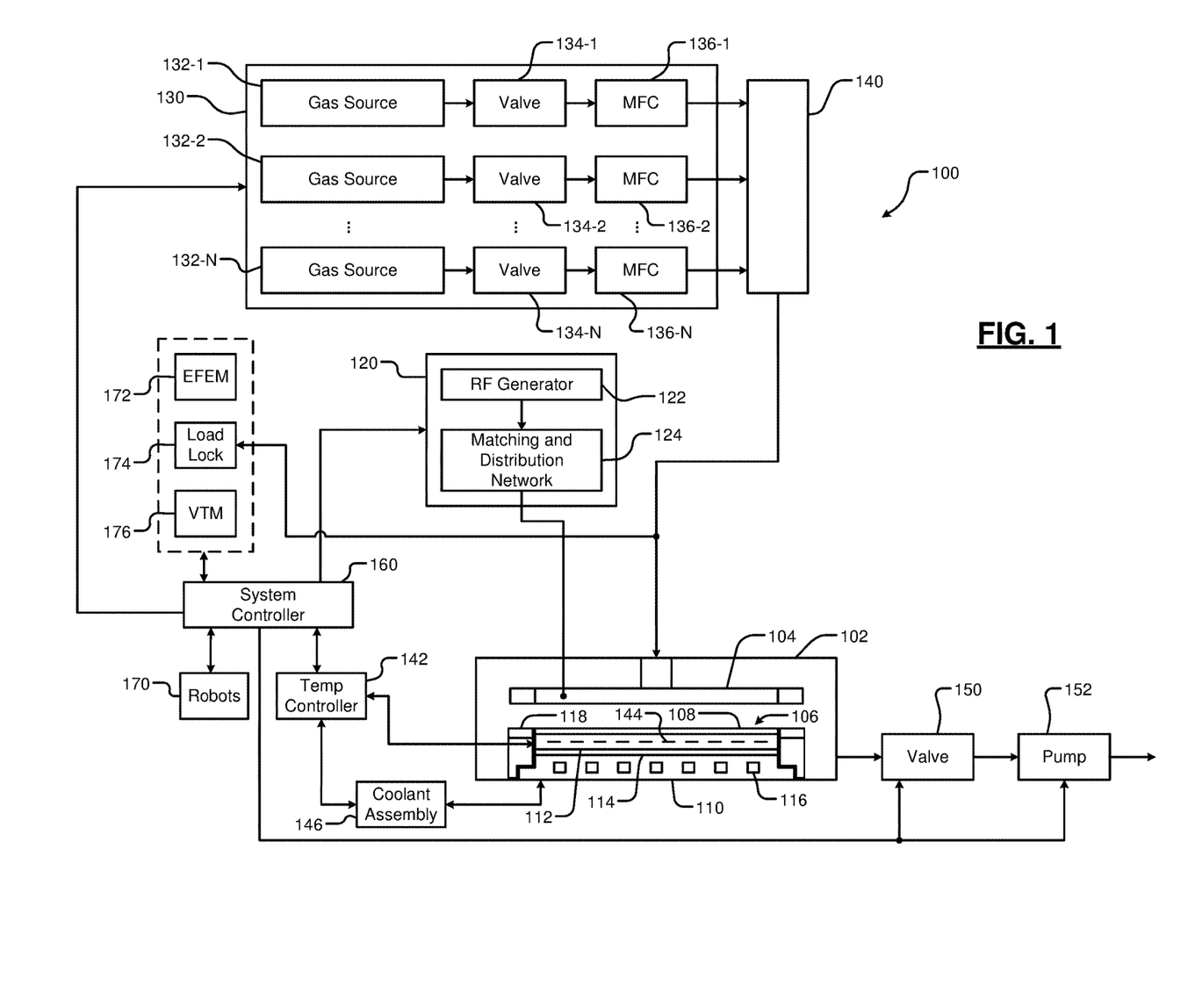
FIG. 1 is a functional block diagram of an example substrate processing system according to the principles of the present disclosure.

Referring now to FIG. 1, an example substrate processing system 100 is shown. For example only, the substrate processing system 100 may be used for performing deposition and/or etching using RF plasma and/or other suitable substrate processing. The substrate processing system 100 includes a processing chamber 102 that encloses other components of the substrate processing system 100 and contains the RF plasma. The processing chamber 102 includes an upper electrode 104 and a substrate support 106, such as an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may correspond to a gas distribution device such as a showerhead that introduces and distributes process gases into the processing chamber 102. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The coolant channels 116 according to the present disclosure include internal features, such as fins, configured to increase cooling efficiency and improve temperature uniformity as described below in more detail. The substrate support 106 may include an RF 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more gas mixtures. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the gas distribution device.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the coolant channels 116. For example, the coolant assembly 146 may include a coolant pump and reservoir. The temperature controller 142 operates the coolant assembly 146 to selectively flow the coolant through the coolant channels 116 to cool the substrate support 106.

A valve 150 and pump 152 may be used to evacuate reactants from the processing chamber 102. A system controller 160 may be used to control components of the substrate processing system 100. One or more robots 170 may be used to deliver substrates onto, and remove substrates from, the substrate support 106. For example, the robots 170 may transfer substrates between an EFEM 172 and a load lock 174, between the load lock 174 and a vacuum transfer module (VTM) 176, between the VTM 176 and the substrate support 106, etc. Although shown as separate controllers, the temperature controller 142 may be implemented within the system controller 160.

Figure 2A:
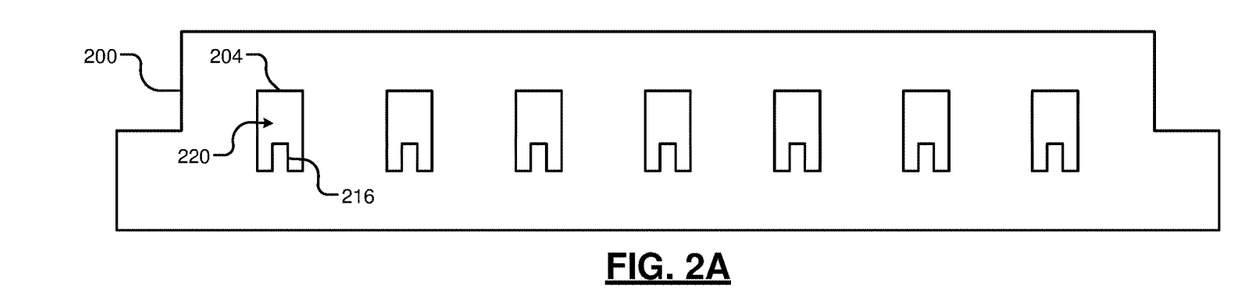
FIG. 2A is an example baseplate including one or more coolant channels according to the principles of the present disclosure.
Figure 2B:
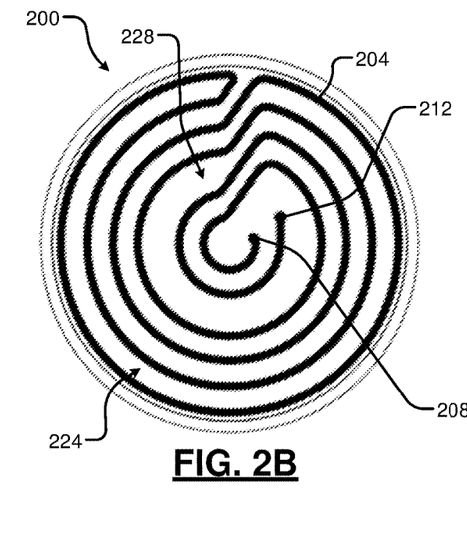
FIG. 2B is a plan view of an example baseplate including a coolant channel according to the principles of the present disclosure.
Figure 2C:
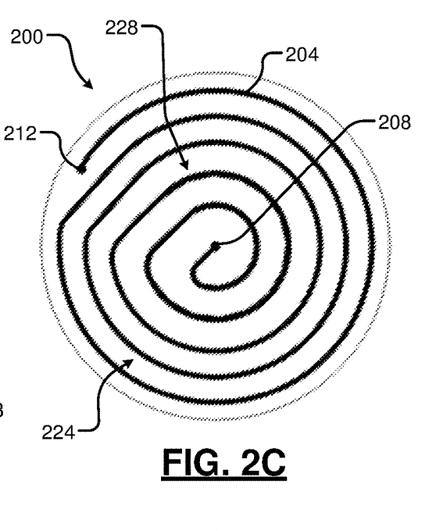
FIG. 2C is a plan view of another example baseplate including a coolant channel according to the principles of the present disclosure.
Figure 2D:
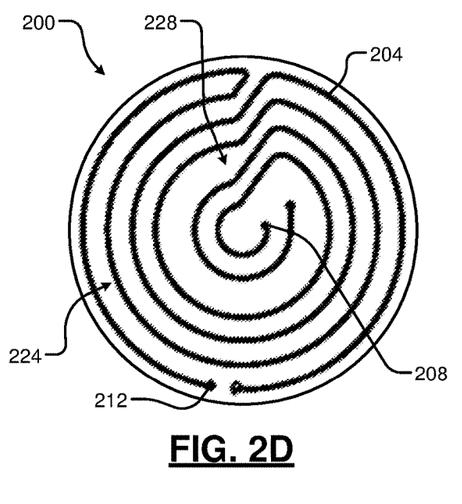
FIG. 2D is a plan view of another example baseplate including a coolant channel according to the principles of the present disclosure.

Referring now to FIGS. 2A, 2B, 2C, 2D, and 2E, an example baseplate 200 including one or more coolant channels 204 according to the present disclosure is shown. FIGS. 2B, 2C, and 2D show example plan views of the baseplate 200 and the coolant channel 204. The coolant channel 204 follows a path configured to distribute coolant throughout an internal volume of the baseplate 200. In the example shown in FIG. 2B, the coolant channel 204 has a single-filar configuration corresponding to a single channel having an inlet 208 and an outlet 212 that are both centrally located. In this example, the coolant channel 204 spirals outward from the inlet 208 to an outer perimeter of the baseplate 200 and then spirals inward from the outer perimeter to the outlet 212. In the example shown in FIG. 2C, the coolant channel 204 has a single-filar configuration where the inlet 208 is centrally-located and the outlet 212 is located near the outer perimeter of the baseplate 200. In this example, the coolant channel 204 spirals outward from the inlet 208 to the outlet 212 located in the outer perimeter of the baseplate 200.

In the example shown in FIG. 2D, the coolant channel 204 has a double-filar configuration corresponding to two channels having respective inlets 208 and outlets 212. In this example, each of the coolant channels 204 spirals outward from the inlets 208 to the outlets 212 located in the outer perimeter of the baseplate 200. In any of the examples shown in FIGS. 2B, 2C, 2D, the inlets 208 may be located near the outer perimeter of the baseplate 200 while the outlets 212 are centrally located. The two coolant channels 204 may be coplanar.

The coolant channel 204 includes an internal feature, such as a fin 216, extending upward into an inner volume 220 defined within the coolant channel 204. Although as shown the fin 216 has a rectangular shape in a cross-section view, in other examples the fin 216 may have other shapes including, but not limited to, trapezoidal, triangular, curved, etc. The fin 216 increases a convection surface area of the coolant channel 204 to increase cooling efficiency of coolant flowing through the coolant channel 204 and improve temperature uniformity. For example, the fin 216 may be continuous and extend along an entire length of the coolant channel 204 (i.e., for multiple revolutions of the coolant channel 204 from at or near the inlet 208 to at or near the outlet 212). In the double-filar configuration shown in FIG. 2D, the fin 216 may be provided in only one or both of the coolant channels 204.

In some examples, the fin 216 may be non-continuous. In other words, the fin 216 may extend along only a portion of the coolant channel 204. For example, the fin 216 may only be located in alternating revolutions of the coolant channel 204 or in alternating portions of respective revolutions of the coolant channel 204. In other examples, the fin 216 may be provided in portions of the coolant channel 204 corresponding to selected zones of the baseplate. For example, processes such as deposition and etching may have radial non-uniformities in respective radial areas (i.e., zones) of a substrate. As one example, outer (i.e., edge) zones of the substrate may be susceptible to non-uniformities such as increased or decreased etching and/or deposition relative to inner zones of the substrate. Processes may compensate for these non-uniformities by separately controlling temperatures in selected zones of the substrate. Accordingly, the fin 216 may only be provided in an edge zone (e.g., in an outermost one or two revolutions) 224 of the coolant channel 204, in an inner zone (e.g., in inner revolutions) 228 of the coolant channel 204, etc. In this manner, the fin 216 may be provided to compensate for temperature and/or other radial non-uniformities. Conversely, in other examples, the fin 216 may be provided in only selected azimuthal regions of the coolant channel 204.

In some examples, the configuration (e.g., shape, size, location, quantity, etc.) of the fin 216 may differ along the length of the coolant channel 204. For example, the fin 216 may transition from rectangular to another shape, from a single one of the fins 216 to two or more of the fins 216 per coolant channel 204, etc. For example only, the fin 216 may have a first configuration in a first radial or azimuthal zone and a second configuration in a second radial or azimuthal zone. In examples where the configuration of the fin 216 changes, the fin 216 may retain a same configuration for some minimum length. For example, the fin 216 may retain a same configuration for at least one revolution of the coolant channel 204 prior to changing to a different configuration. In this manner, flow of the coolant through the coolant channel 204 can be maintained at a desired flow rate with minimal turbulence.

Figure 2E:
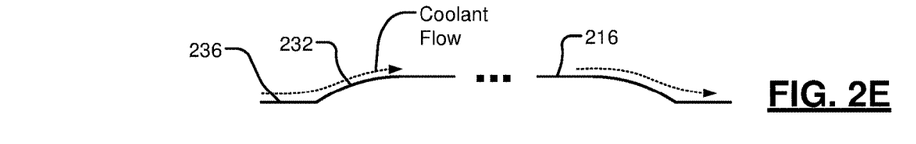
FIG. 2E is a side view of an example fin provided in a coolant channel according to the principles of the present disclosure.

Transitions between configurations of the fin 216 (e.g., between portions of the coolant channel 204 that do not include the fin 216 and portions of the coolant channel 204 that do include the fin 216) may be structured to further maintain flow efficiency and minimize turbulence. For example, FIG. 2E shows a side view of the fin 216 transitioning between portions of the coolant channel 204 that do not include the fin 216 and portions that do include the fin 216. The fin 216 includes sloped transition regions 232 (e.g., located at respective ends of the fin 216) configured to facilitate flow (as indicated by the arrows) of the coolant upward around the fin 216 in a vertical direction. Although shown as generally sloping upward in a curved, convex manner (e.g., sloping upward from a bottom surface 236 of the coolant channel 204), in other examples the transition regions 232 may slope upward linearly, in a concave manner, etc. Similarly, the transition regions may slope laterally outward toward outer walls of the coolant channel 204. For example only, a width of the fin 216 may be 30-50% of a width of the coolant channel 204. A height of the fin 216 may be 20-40% of a height of the coolant channel 204.

In some examples, flow of the coolant through the coolant channel 204 may be adjusted (e.g., using the system controller 160, the temperature controller 142, and/or the coolant assembly 146 as described above in FIG. 1) in accordance with the presence of the fin 216 within the coolant channel 204. For example, the fin 216 reduces a cross-sectional area of the coolant channel 204 and therefore may restrict flow. Accordingly, the temperature controller 142 may be configured to increase coolant pressure to maintain a desired flow rate and/or temperature of the coolant. In some examples, the coolant channel 204 (e.g., an inlet of the coolant channel 204) may include a sensor configured to detect and provide the flow rate to the temperature controller 142. The temperature controller 142 selectively increases and decreases pressure to maintain the desired flow rate and/or temperature based on the sensed flow rate.

Similarly, the temperature controller 142 is configured to control the flow rate and temperature of the coolant based on desired temperatures (e.g., in respective zones of the substrate support 106, substrate, etc.). For example, the temperature controller 142 receives temperature signals (e.g., from one or more sensors arranged in respective locations of the substrate support 106, a coolant temperature sensor, etc.) and/or calculates or estimates temperatures based on other known parameters (e.g., including, but not limited to, power provided to the substrate support 106, coolant flow rates, etc.). The temperature controller 142 increases and decreases the coolant flow rate and temperature to correspondingly decrease and increase temperatures of the substrate based on the desired temperatures and the sensed and/or calculated temperatures.

Figure 3A:
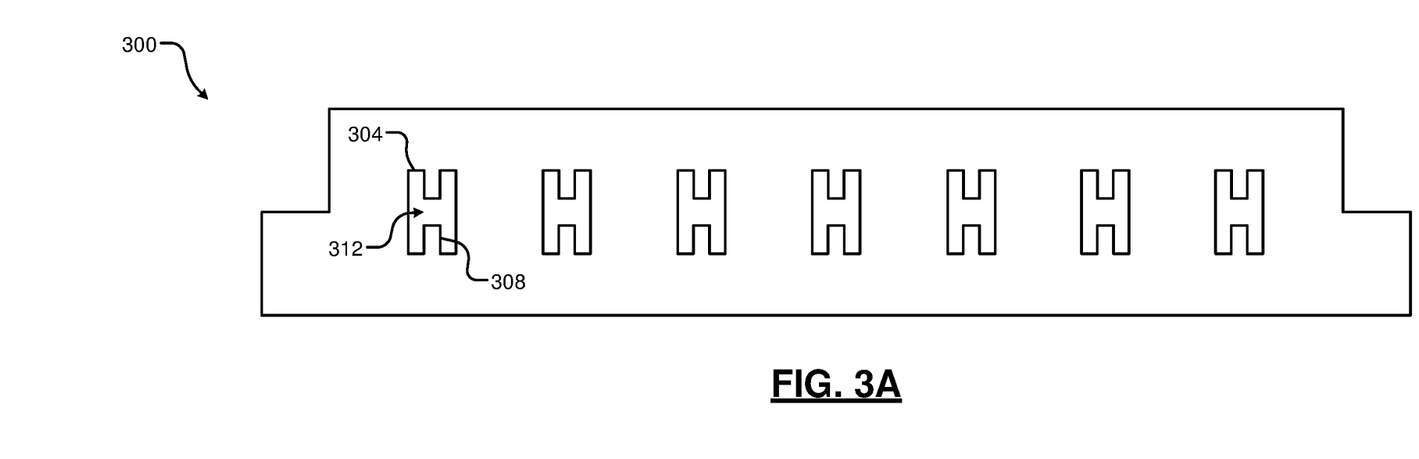
FIGS. 3A-3E illustrate a baseplate including other example configurations of a coolant channel and one or more fins according to the principles of the present disclosure.
Figure 3B:
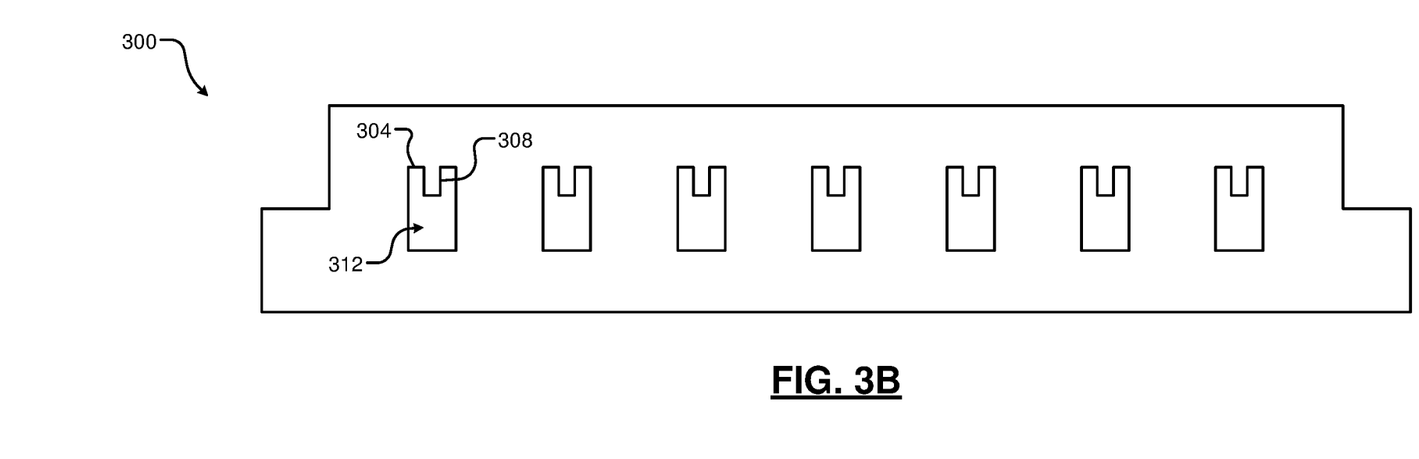
Figure 3C:
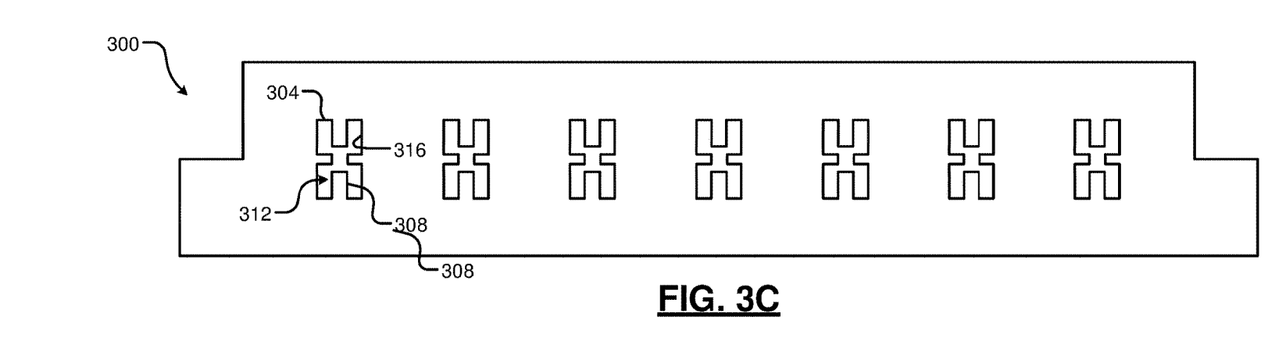
Figure 3D:
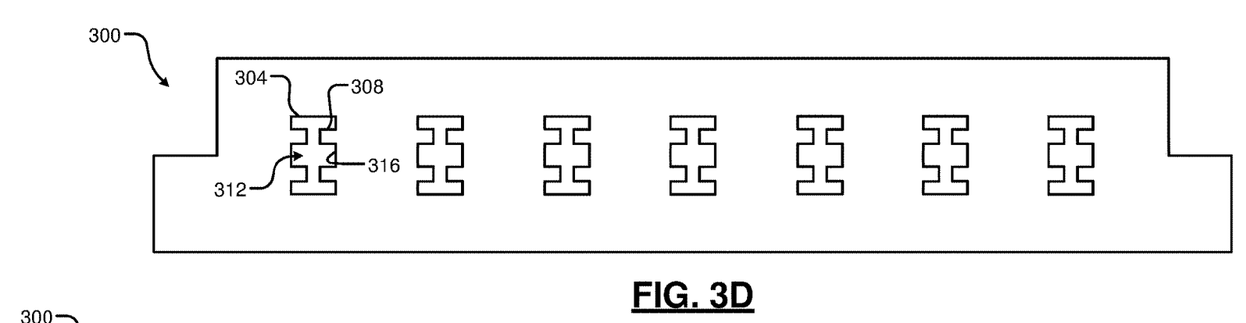

Referring now to FIGS. 3A, 3B, 3C, 3D, and 3E, a baseplate 300 including other example configurations of a coolant channel 304 and fin 308 according to the present disclosure is shown. As shown in FIG. 3A, the coolant channel 304 includes two of the fins 308 extending upward and downward, respectively, into an inner volume 312 of the coolant channel 304. As shown in FIG. 3B, the fin 308 extends downward into the inner volume 312 of the coolant channel 304. As shown in FIG. 3C, the coolant channel 304 includes two of the fins 308 extending upward and downward, respectively, into the inner volume 312 of the coolant channel 304 and two of the fins 308 extending inward from respective sidewalls 316 of the coolant channel 304. As shown in FIG. 3D, the coolant channel 304 includes two of the fins 308 extending from each of the sidewalls 316 of the coolant channel 304.

Figure 3E:
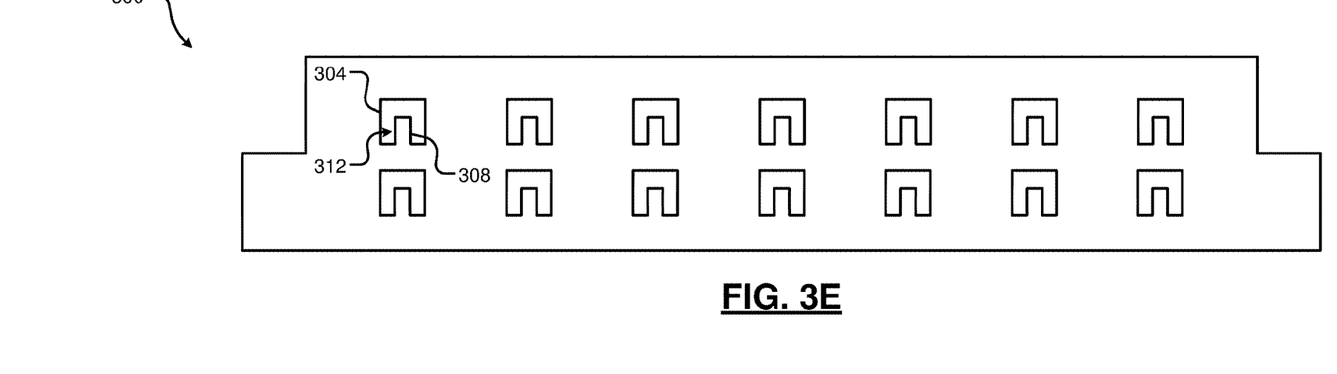

As shown in FIG. 3E, two or more (i.e., two or more layers) of the coolant channels 304 may be formed within the baseplate 300. Respective layers of the coolant channels 304 may be aligned (as shown) or offset from each other in a vertical direction. The respective fins 308 of the two or more layers of the coolant channels 304 may have a same configuration (as shown) or a different configuration.

Figure 4A:
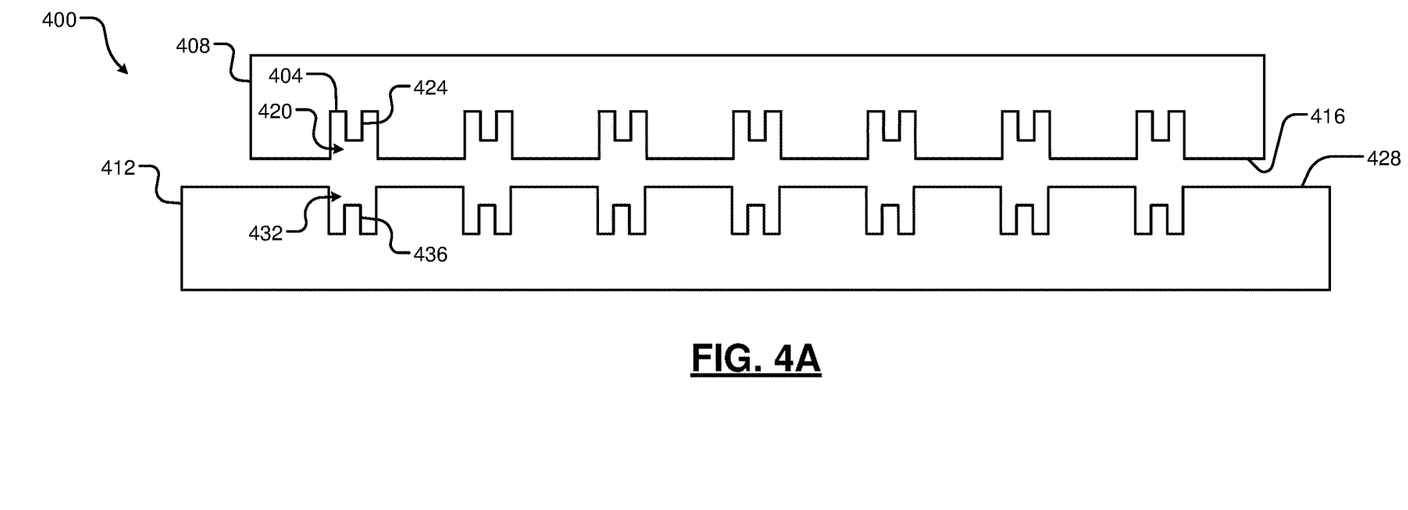
FIGS. 4A and 4B illustrate an example manufacturing process for a baseplate including an example coolant channel according to the principles of the present disclosure.
Figure 4B:
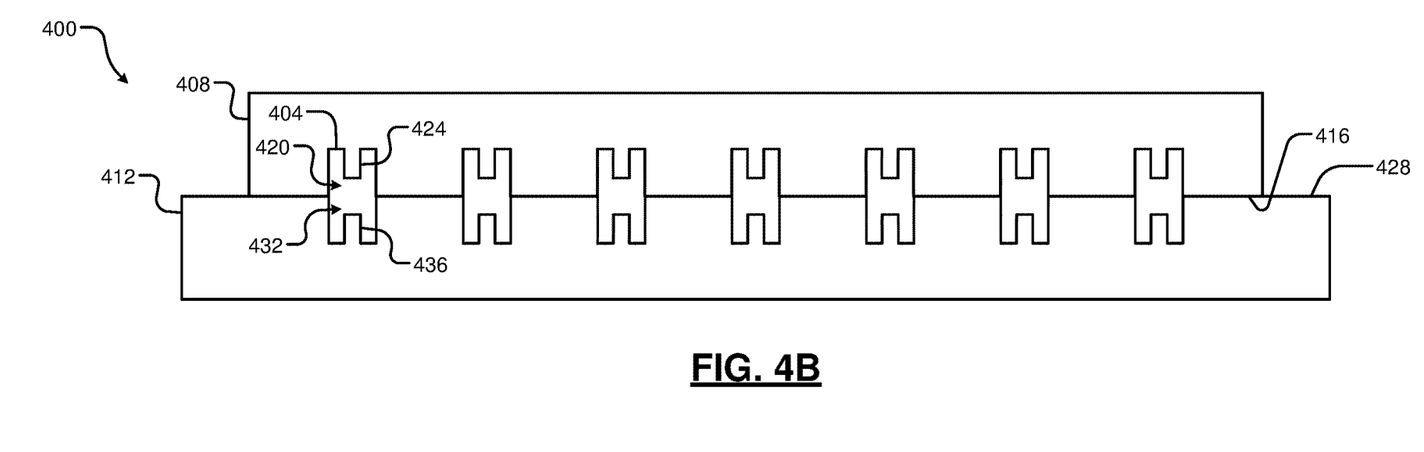

FIGS. 4A and 4B illustrate an example manufacturing process for a baseplate 400 including an example coolant channel 404 according to the present disclosure. For example, the baseplate 400 may include separately manufactured top and bottom plates 408 and 412. A bottom surface 416 of the top plate 408 is machined to form a top portion 420 of the coolant channel 404 and, optionally, a fin 424. Conversely, a top surface 428 of the bottom plate 412 is machined to form a bottom portion 432 of the coolant channel 404 and, optionally, a fin 436. Although shown with the fins 424 and 436 extending downward and upward, respectively, the coolant channel 404 can be machined to include any configuration of one or more fins, including the configurations shown in FIGS. 3A-3E. Further, although the fins 424 and 436 are described as being machined into the material of the baseplate 400, in other examples the fins 424 and 436 may comprise a same or different material that is attached to the coolant channel 404 subsequent to the machining. The top plate 408 and the bottom plate 412 are then attached (e.g., brazed) together as shown in FIG. 4B.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A baseplate for a substrate support in a substrate processing system, the baseplate comprising:
    at least one coolant channel formed within the baseplate, wherein (i) the at least one coolant channel defines a volume within the baseplate configured to retain a coolant and (ii) the at least one coolant channel follows a path configured to distribute the coolant in the volume throughout the baseplate, and wherein the at least one coolant channel comprises a plurality of turns distributed radially across the baseplate, the plurality of turns comprising a first set of turns located in a radially outer zone of the baseplate and a second set of turns located in a radially inner zone of the baseplate; and
    at least one fin provided within the at least one coolant channel, wherein the at least one fin extends from at least one of a top, a bottom, and a sidewall of the at least one coolant channel into the volume to increase a surface area of the at least one coolant channel;
    wherein the at least one fin comprises a plurality of fins; and
    wherein the first set of turns comprises a first set of fins of the plurality of fins having a fixed height, the second set of turns comprises a second set of fins of the plurality of fins, and a height of the second set of fins decreases from an outermost turn to an innermost turn of the second set of turns.

2. The baseplate of claim 1, wherein the at least one fin extends upward from the bottom of the at least one coolant channel into the volume.

3. The baseplate of claim 1, wherein the at least one fin extends downward from the top of the at least one coolant channel into the volume.

4. The baseplate of claim 1, wherein the at least one fin includes a first fin extending upward from the bottom of the at least one coolant channel into the volume and a second fin extending downward from the top of the at least one coolant channel into the volume.

5. The baseplate of claim 1, wherein the at least one fin includes a first fin extending upward from the bottom of the at least one coolant channel into the volume, a second fin extending downward from the top of the at least one coolant channel into the volume, and a third fin extending inward from the sidewall of the at least one coolant channel into the volume.

6. The baseplate of claim 1, wherein the at least one fin includes a first fin and a second fin extending inward from the sidewall of the at least one coolant channel into the volume.

7. The baseplate of claim 1, wherein the at least one fin includes a first fin and a second fin, wherein the at least one coolant channel includes a first coolant channel and a second coolant channel, wherein the first coolant channel includes the first fin, and wherein the second coolant channel includes the second fin.

8. The baseplate of claim 7, wherein the second coolant channel is arranged above the first coolant channel.

9. The baseplate of claim 8, wherein the second coolant channel is aligned with the first coolant channel in a vertical direction.

10. The baseplate of claim 8, wherein the second coolant channel is offset from the first coolant channel in a vertical direction.

11. The baseplate of claim 7, wherein the first coolant channel and the second coolant channel are coplanar.

12. The baseplate of claim 1, wherein the at least one fin has a rectangular cross-sectional shape.

13. The baseplate of claim 1, wherein the at least one fin has a triangular cross-sectional shape.

14. The baseplate of claim 1, wherein the at least one fin has a trapezoidal cross-sectional shape.

15. The baseplate of claim 1, wherein the at least one fin has a curved cross-sectional shape.

16. The baseplate of claim 1, wherein the at least one fin extends continuously from an inlet of the at least one coolant channel to an outlet of the at least one coolant channel.

17. The baseplate of claim 1, wherein the at least one fin is discontinuous.

18. The baseplate of claim 1, wherein the at least one fin is provided in a first portion of the at least one coolant channel and is not provided in a second portion of the at least one coolant channel.

19. The baseplate of claim 18, wherein the first portion and the second portion correspond to first and second zones, respectively, of the baseplate.

20. The baseplate of claim 1, wherein a configuration of the at least one fin changes along a length of the at least one coolant channel.

21. The baseplate of claim 20, wherein the configuration of the at least one fin includes at least one of a shape, a size, a location, and a quantity of the at least one fin.

22. The baseplate of claim 21, the configuration of the at least one fin continues for at least one revolution of the at least one coolant channel.

23. The baseplate of claim 1, wherein first and second ends of the at least one fin include sloped transition regions.

24. The baseplate of claim 1, wherein a width of the at least one fin is 30-50% of a width of the at least one coolant channel.

25. The baseplate of claim 1, wherein a height of the at least one fin is 20-40% of a height of the at least one coolant channel.

26. The baseplate of claim 1, wherein the innermost turn has no fins.

27. The baseplate of claim 1, wherein the at least one coolant channel extends spirally in a single direction from center to periphery of the baseplate.

28. The baseplate of claim 1, wherein the at least one coolant channel has a uniform cross-section.

29. The baseplate of claim 1, wherein the at least one coolant channel comprises a single channel.

* * * * *